United States Patent [19]

Okubo

[11] Patent Number: 5,029,135
[45] Date of Patent: Jul. 2, 1991

[54] SEMICONDUCTOR MEMORY APPARATUS WITH INTERNAL SYNCHRONIZATION

[75] Inventor: Hiizu Okubo, Nishinomiya, Japan

[73] Assignee: Ricoh Company, Ltd., Tokyo, Japan

[21] Appl. No.: 480,583

[22] Filed: Feb. 15, 1990

[30] Foreign Application Priority Data

| Feb. 15, 1989 | [JP] | Japan | 1-35909 |
| May 18, 1989 | [JP] | Japan | 1-125298 |
| Nov. 29, 1989 | [JP] | Japan | 1-311521 |

[51] Int. Cl.$^5$ .............. G11C 7/00; G11C 11/407; G11C 11/413
[52] U.S. Cl. .................. 365/203; 365/210; 365/233.5
[58] Field of Search ............ 365/203, 210, 233, 233.5, 365/189.01

[56] References Cited

U.S. PATENT DOCUMENTS

| 4,417,328 | 11/1983 | Ochii | 365/203 |
| 4,888,737 | 12/1989 | Sato | 365/203 |
| 4,953,130 | 8/1990 | Houston | 365/203 |

Primary Examiner—Alyssa H. Bowler
Attorney, Agent, or Firm—Cooper & Dunham

[57] ABSTRACT

A semiconductor memory apparatus of an internal synchronization type uses a clock signal generated by detecting a change in address or control signal as an internal synchronization signal. The apparatus includes a dummy memory cell for fixing data thereto in advance; a precharging circuit for precharging an internal memory cell and the dummy cell; a precharge completion detector for detecting the completion of the precharging operation when a dummy bit line from the dummy cell attains a predetermined voltage level by the precharging operation, the precharge completion detector transmitting a signal for completing the precharging operation with respect to the precharging circuit; and a device for reading or writing data through a bit line to the memory cell by the completion of the precharging operation by the precharge completion detector.

5 Claims, 9 Drawing Sheets

SEMICONDUCTOR MEMORY APPARATUS WITH INTERNAL SYNCHRONIZATION

BACKGROUND OF THE INVENTION

1. Field of the Invention

The present invention relates to a semiconductor memory apparatus which can perform a reading operation at a high speed.

2. Description of the Related Art

Recently, there have been a large amount of demands with respect to LSI (ASIC) for specified uses. A maker for manufacturing LSIs has been developing a compile system for preparing functional blocks constituting a memory in advance and synthesizing the functional blocks by software so as to rapidly correspond to various requirements of users with respect to ASIC.

However, in the memory of the above-mentioned compile system, a delay time for securing a sufficient precharging operation cannot be fixed to a minimum value since a user designates the construction of bits and words. When a variable delay time is set by a combination of resistors and capacitors, the delay time is set to be large by 10 to 100% to secure the operations thereof in consideration of a dispersion in process, a change in temperature, etc. An access time is increased by this margin of the delay time.

In a circuit for generating an internal clock signal, with respect to a pulse of a SAT signal transmitted from this generating circuit, a time difference in rise between a pulse of a supplied ATD signal and the pulse of the SAT signal is determined by the relation between the ability of a PMOS transistor as a load transistor, a capacitor on an output line, and the ability of NMOS transistors as a drive transistor. On the other hand, a time difference in fall between the ATD signal and the SAT signal is determined by the relation between the ability of the PMOS transistor and the capacitor on the output line. To prepare the operations of the respective circuit elements for the next operating cycle, it is necessary to reduce the fall of the SAT signal, i.e., the fall time difference.

However, in the above circuit, both the rise time difference and the fall time difference cannot be decreased, thereby preventing the memory from being operated at a high speed. Further, when the fall time difference is decreased, the consumed amount of an electric current is increased and therefore the consumed amount thereof cannot be reduced.

In the internal clock signal generating circuit, the delay time is increased since the ATD signal is transmitted through many circuit elements so that the memory cannot be also operated at a high speed.

SUMMARY OF THE INVENTION

It is therefore a first object of the present invention to provide a semiconductor memory apparatus which can be operated at a high speed by especially detecting the completion of a precharging operation on a bit line with respect to a circuit construction for realizing a memory of a compile system of an internal synchronization type.

A second object of the present invention is to provide a semiconductor memory apparatus which can be operated at a high speed by providing an inverted SAT signal generating circuit operated at a high speed by reducing both a rise time difference and a fall time difference of the SAT signal with respect to the ATD signal.

A third object of the present invention is to provide a semiconductor memory apparatus having an inverted SAT signal generating circuit having a small consumed amount of the electric current.

The above objects of the present invention can be achieved by a semiconductor memory apparatus of an internal synchronization type using a clock signal generated by detecting a change in address or control signal as an internal synchronization signal, the apparatus comprising a dummy memory cell for fixing data thereto in advance; a precharging circuit for precharging an internal memory cell and the dummy cell; precharge completion detecting means for detecting the completion of the precharging operation when a dummy bit line from the dummy cell attains a predetermined voltage level by the precharging operation, the precharge completion detecting means transmitting a signal for completing the precharging operation with respect to the precharging circuit; and means for reading or writing data through a bit line to the memory cell by the completion of the precharging operation by the precharge completion detecting means.

By such a construction, the memory cell and the dummy cell are precharged by the precharging circuit. When the dummy bit line from the dummy cell attains the predetermined precharge level by the above precharging operation, the precharge completion detecting means detects the completion of the precharging operation and outputs the signal for completing the precharging operation. After the precharging operation has been completed by this signal, a signal on a word line immediately rises to read the data out of the memory cell.

The present invention also resides in a semiconductor memory apparatus having an internal signal generating circuit for generating an internal signal by detecting a change in supplied signal and a precharging circuit for precharging a bit line of a semiconductor memory cell by the supply of the internal signal, the apparatus comprising a first transistor connected to an output line of the internal signal generating circuit and having an ability for supplying an electric current set to be small such that a signal level of the output line is maintained at a predetermined voltage level; a second transistor connected to the output line of the internal signal generating circuit and having an ability for supplying the electric current set to be large such that the output line of the internal signal generating circuit can be rapidly charged by turning the second transistor on; and a first circuit for turning the second transistor on after the completion of the precharging operation on the bit line after the internal signal is generated.

By such a construction, the electric current is supplied to the output line of the internal signal generating circuit through the first transistor and this output line is maintained at a high voltage level for example. Since the first transistor is selected to have the small electric current supply ability so that the supply amount of the electric current to the above output line is small and the consumed amount of the electric current is also small when the internal signal is generated.

When the signal is changed, the signal level on the above output line is changed to a low voltage level for example and this change in signal level is transmitted to the precharging circuit as the internal signal. After the internal signal is transmitted and a predetermined time has passed, the first circuit turns the second transistor on. Since the second transistor is selected to have the large electric current supply ability, the output line of the internal signal generating circuit is rapidly charged by the second transistor. Thus, the above output line can rapidly correspond to the next operating cycle.

The present invention also resides in a semiconductor memory apparatus of an internal synchronization type having an internal signal generating circuit for generating an internal synchronization signal by detecting a change in address or control signal, the apparatus comprising a dummy memory cell for fixing data thereto in advance; a precharging circuit for precharging an internal memory cell and the dummy cell; precharge completion detecting means for detecting the completion of the precharging operation when a dummy bit line from the dummy cell attains a predetermined voltage level by the precharging operation, the precharge completion detecting means transmitting a signal for completing the precharging operation with respect to the precharging circuit; a first transistor connected to an output line of the internal signal generating circuit and having an ability for supplying an electric current set to be small such that a signal level of the output line is maintained at a predetermined voltage level; a second transistor connected to the output line of the internal signal generating circuit and having an ability for supplying the electric current set to be large such that the output line of the internal signal generating circuit can be rapidly charged by turning the second transistor on; and a first circuit for turning the second transistor on after the completion of the precharging operation on the bit line after the internal signal is generated.

By such a construction composed of a combination of the above first and second constructions, the semiconductor memory apparatus is operated at a higher speed.

Further objects and advantages of the present invention will be apparent from the following description of the preferred embodiments of the present invention as illustrated in the accompanying drawings.

DESCRIPTION OF THE PREFERRED EMBODIMENTS

The preferred embodiments of a semiconductor memory apparatus in the present invention will next be described in detail with reference to the accompanying drawings.

Figure 1:
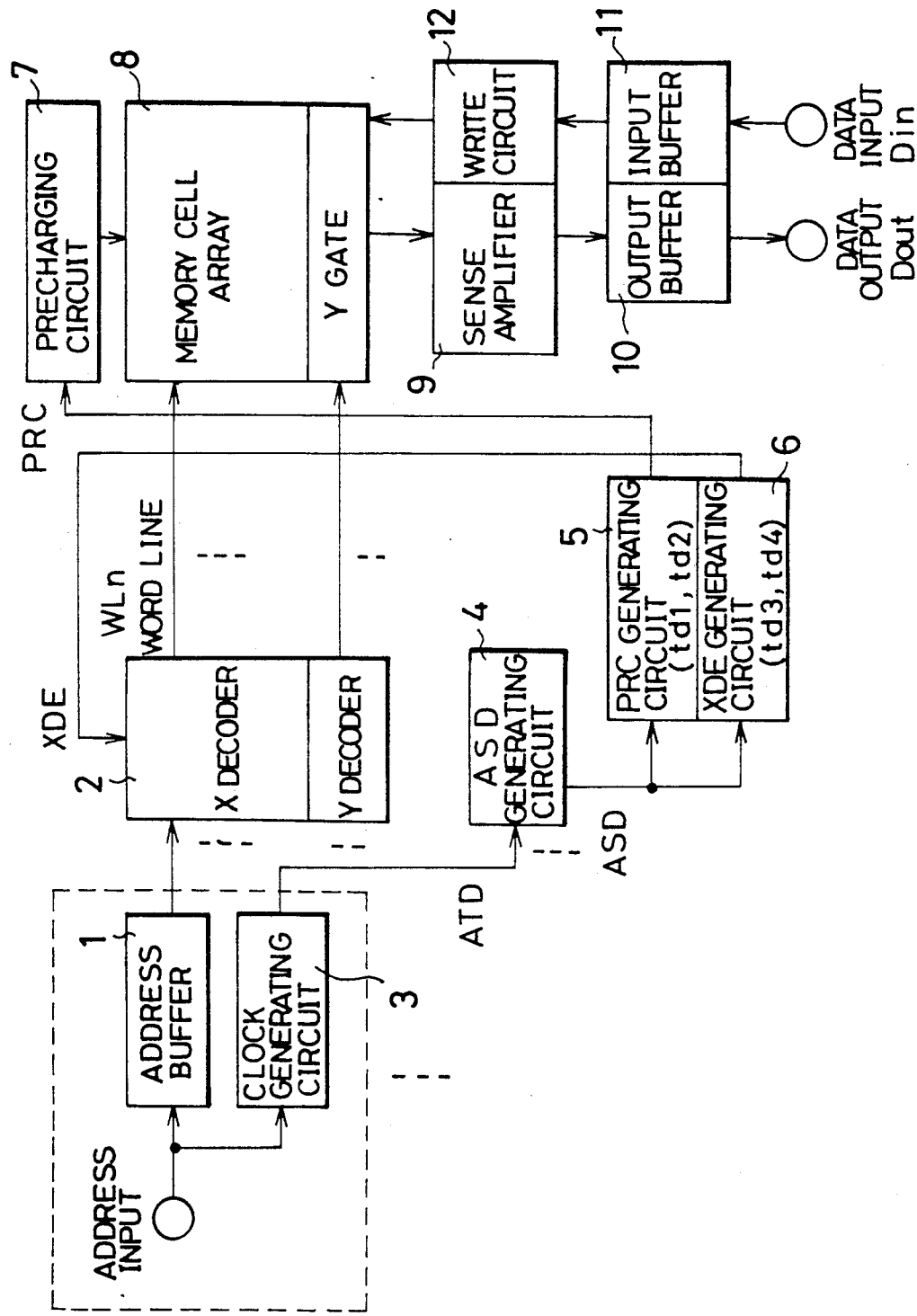
FIG. 1 is a block diagram of a memory of an internal synchronization type.
Figure 2:
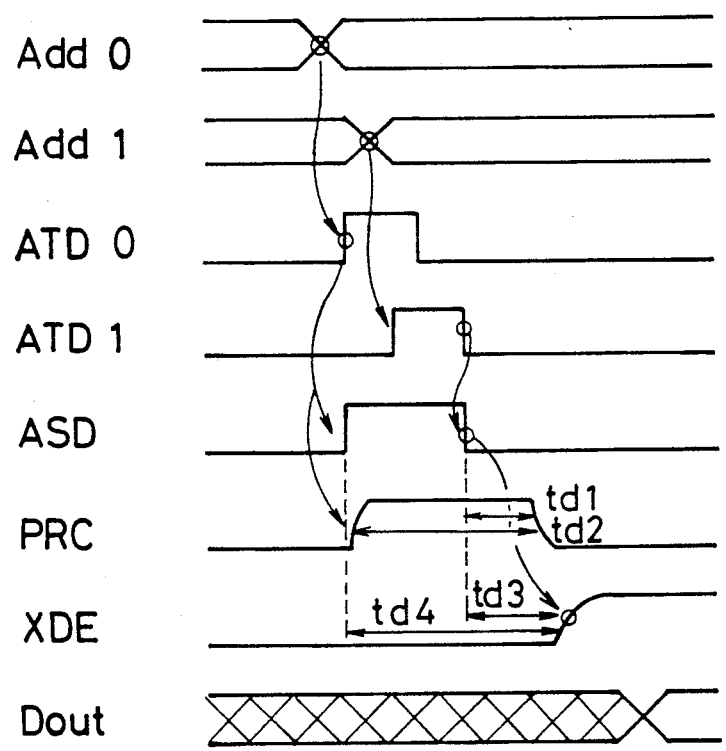
FIG. 2 is a timing chart showing the operation of the memory of FIG. 1.

FIG. 1 shows a memory of an internal synchronization type and the operation of this memory is performed as follows with reference to a timing chart shown in FIG. 2.

When there is an address input, an address signal is transmitted to X and Y decoders 2 through an address buffer 1 and each clock generating circuit 3 transmits an ATD (ATDn) signal to an ASD generating circuit 4 in synchronization with a change in address input. When all the ATD signals are inputted, an ASD signal is transmitted from the ASD generating circuit 4 to a PRC generating circuit 5 and an XDE generating circuit 6. This ASD signal rises when a first ATD0 signal rises and falls when a last ATD1 signal falls. Namely, in a period in which the ASD signal is at a high voltage level, the address is in an unfixed state. When the ASD signal attains the high voltage level, the PRC generating circuit makes a PRC signal for controlling a precharging operation rise. This PRC signal is transmitted to a precharging circuit 7 so that the precharging operation is started in the memory cell 8. The completion of the precharging operation is determined after a later time of a time td2 from the beginning of the precharging operation and a time td1 from the fall of the ASD signal. These times td1 and td2 are set to be longer than a time required to preform the precharging operation.

On the other hand, the XDE generating circuit 6 makes an XDE signal for controlling the operation on a word line rise after a later time of a time td4 from the rise of the ASD signal and a time td3 from the fall of the ASD signal. When this XDE signal rises, a signal on a word line WLn transmitted to the memory cell 8 from the X decoder 2 rises so that data are read out of the memory cell 8 and are outputted through a sense amplifier 9 and an output buffer 10.

It is necessary to set the rise of the signal on the word line WLn so as to begin after the completion of the precharging operation. Therefore, the above times td3 and td4 include a predetermined delay time to secure a sufficient precharge.

However, in the memory of the abovementioned compile system, the above delay time cannot be fixed to a minimum value since a user designates the construction of bits and words. When a variable delay time is set by a combination of resistors and capacitors, the delay time is set to be large by 10 to 100% to secure the operations thereof in consideration of a dispersion in process, a change in temperature, etc. An access time is increased by this margin of the delay time.

Figure 3:
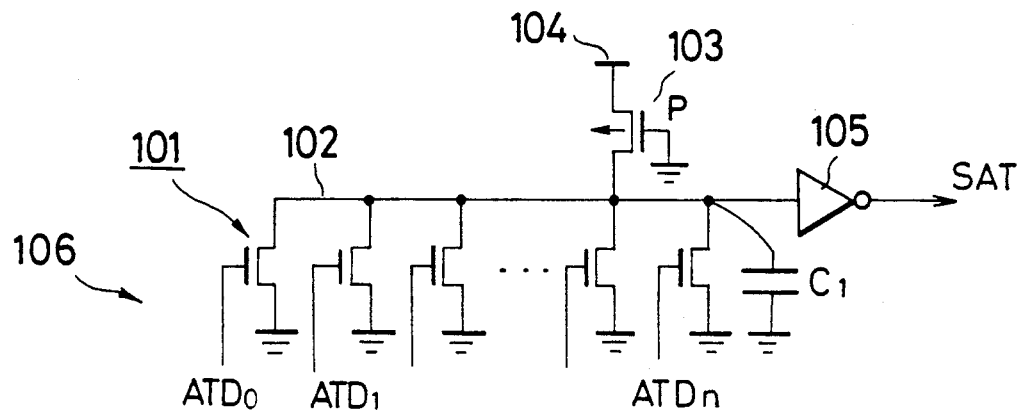
FIG. 3 is a circuit diagram showing one constructional example of a SAT signal generating circuit.
Figure 4:
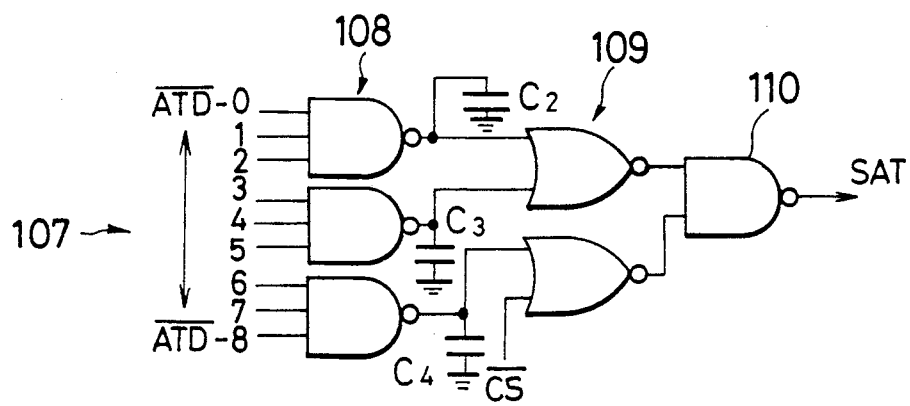
FIG. 4 is a logic circuit diagram showing another constructional example of the SAT signal generating circuit.

In the semiconductor memory of the internal synchronization system, as mentioned above, the change in input signal supplied to the memory apparatus is detected and an internal clock signal is generated and the semiconductor memory is operated in synchronization with this internal clock signal. FIGS. 3 and 4 show circuits for generating such an internal clock signal. In an internal clock signal generating circuit 106 shown in FIG. 3, the drains of a plurality of NMOS transistors 101 are connected to an output line 102 and a predetermined potential is applied from a power source 104 to this output line 102 through a PMOS transistor 103 having a gate connected to the ground. A plurality of unillustrated ATD circuits are connected to the gates of the NMOS transistors 101 and detect the change in the above input signal and transmit the ATD signal. The respective sources of the NMOS transistors 101 are connected to the ground.

Thus, the output line 102 is normally connected to the power source 104 through the PMOS transistor 103 and is thereby at a high voltage level for example. Therefore, the internal clock signal generating circuit 106 transmits a signal at a low voltage level through an inverter 105. However, when the ATD signal is supplied from the ATD circuit, the NMOS transistors 101 are turned on and the output line 102 is connected to the ground. Accordingly, the internal clock signal generating circuit 106 transmits an internal signal (which is called an SAT signal in the following description) at the high voltage level.

In the internal clock signal generating circuit 106 constructed above, the ATD circuits are dispersed on an IC chip so that a wiring capacitor C1 provided by a long wiring of such circuits is added onto the output line 102.

The internal clock signal generating circuit 107 shown in FIG. 4 divides the supplied ATD signals into small groups to disperse this wiring capacitor and the ATD signals are supplied to respective NAND circuits 108. NOR circuits 109 are connected to output sides of the respective NAND circuits 108 and a NAND circuit 110 is connected to output sides of the NOR circuits 109.

Figure 5:
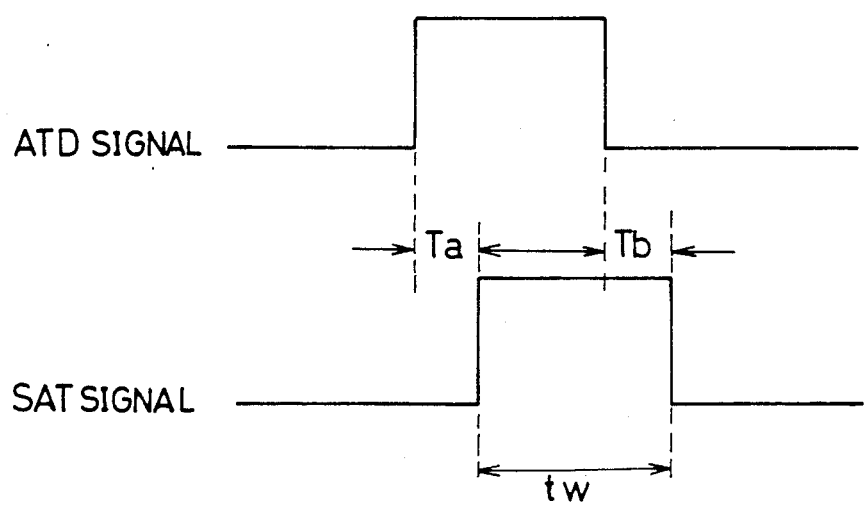
FIG. 5 is a view showing time differences in rise and fall of a SAT signal with respect to an ATD signal.

In the internal clock signal generating circuit 106 shown in FIG. 3, with respect to a pulse of the SAT signal transmitted from this generating circuit, as shown in FIG. 5, a time difference Ta in rise between a pulse of the supplied ATD signal and the pulse of the SAT signal is determined by the relation between the ability of the PMOS transistor 103 as a load transistor, the capacitor C1 on the output line 102, and the ability of the NMOS transistors 101 as a drive transistor. On the other hand, a time difference Tb in fall between the ATD signal and the SAT signal is determined by the relation between the ability of the PMOS transistor 103 and the capacitor C1 on the output line 102. To prepare the operations of the respective circuit elements for the next operating cycle, it is necessary to reduce the fall of the SAT signal, i.e., the fall time difference Tb.

However, the ability of the PMOS transistor 103 is constant and the potential of the power source 104 connected to the PMOS transistor 103 is also constant. Accordingly, with respect to the ability of the PMOS transistor 103, the fall time difference Tb is increased when the rise time difference Ta is decreased. Conversely, the rise time difference Ta is increased when the fall time difference Tb is decreased. Accordingly, as a compromising means, the rise time difference Ta is increased and the fall time difference Tb is decreased so that both the rise time difference Ta and the fall time difference Tb cannot be decreased, thereby preventing the memory from being operated at a high speed.

In the internal clock signal generating circuit 106, an electric current flows to the ground from the power source 104 through the PMOS transistor 103 and the NMOS transistors 101 while the ATD signal is supplied to the NMOS transistors 101. The value of this electric current is determined by an electric current supply ability of the PMOS transistor 103 relating to a consumed amount of the electric current. When the fall time difference Tb is decreased, this consumed amount of the electric current is increased and therefore the consumed amount thereof cannot be reduced.

In the internal clock signal generating circuit 107 shown in FIG. 4, the delay time is increased since the ATD signal is transmitted through many circuit elements so that the memory cannot be operated at a high speed.

In a first embodiment of the present invention, it is possible to operate a semiconductor memory at a high speed by detecting the completion of a precharging operation on a bit line of the semiconductor memory.

Figure 6:
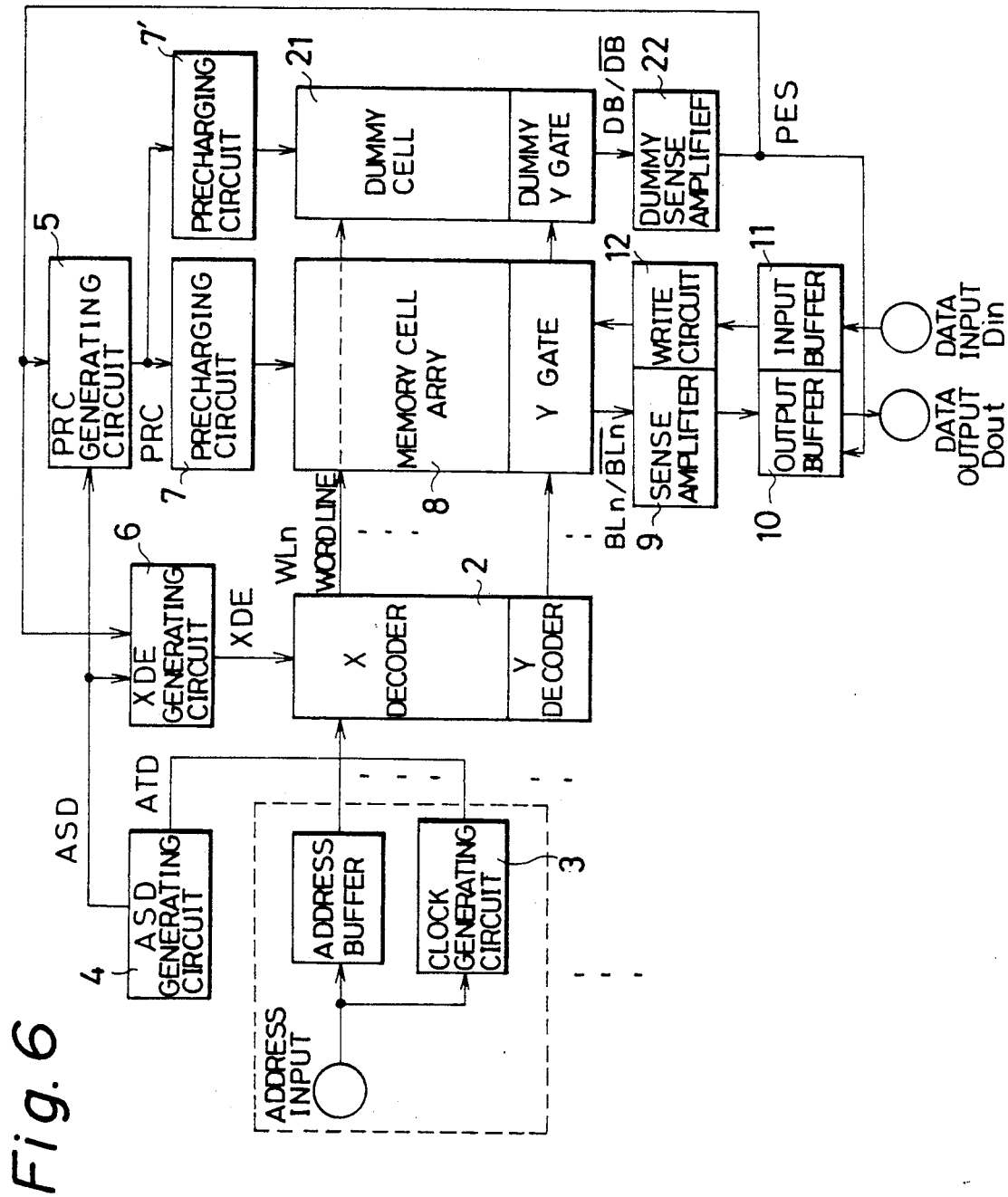
FIG. 6 is a block diagram showing a semiconductor memory apparatus in a first embodiment of the present invention.

FIG. 6 shows a semiconductor memory apparatus in the first embodiment of the present invention. In FIG. 6, the same portions as those in FIG. 1 are designated by the same reference numerals.

A dummy cell 21 corresponding to a memory cell 8 is disposed and a precharging circuit 7' is disposed to precharge this dummy cell 21. A sense amplifier 22 is disposed to amplify a signal on a dummy bit line DB/$\overline{DB}$ from the dummy cell 21.

Figure 7:
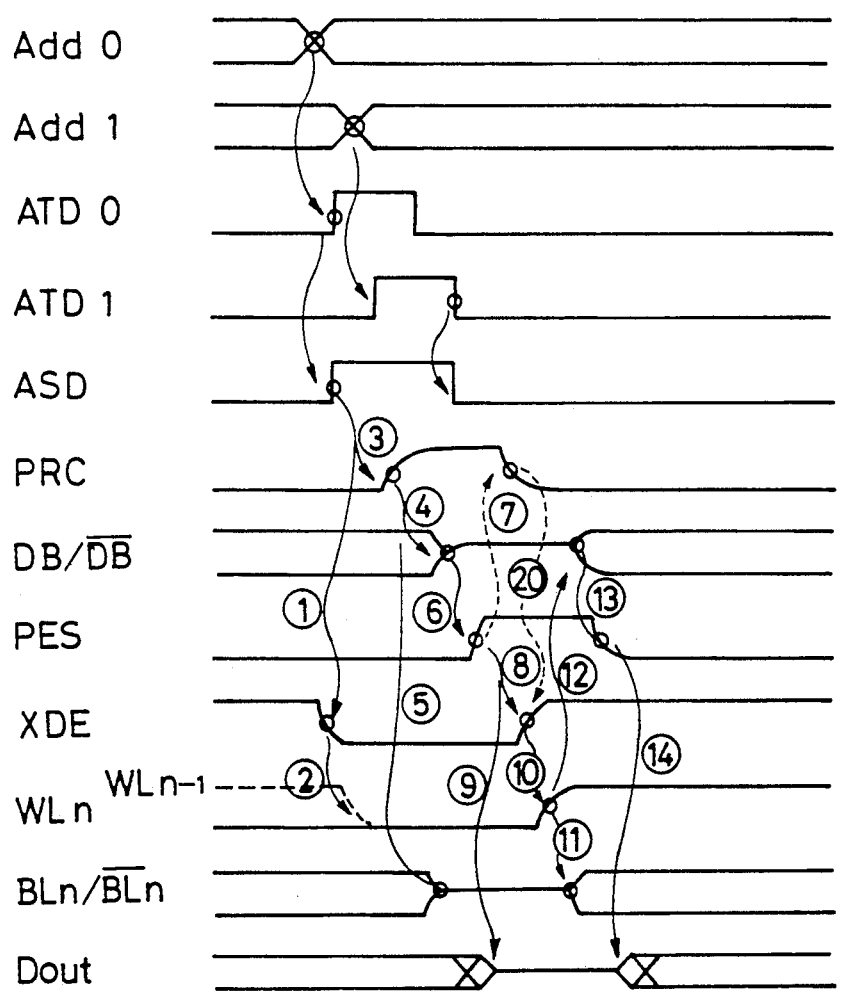
FIG. 7 is a timing chart showing the operation of the semiconductor memory apparatus of FIG. 6.

The operation of the semiconductor memory apparatus constructed above will next be described on the basis of a timing chart shown in FIG. 7. The operation of the apparatus until the generation of an ASD signal is similar to that described in the above-mentioned example of FIGS. 1 to 5 and therefore this operation is omitted in the following description. Further, in the following description, numbers in circles are in conformity with those in FIG. 7.

When the ASD signal rises, an XDE signal falls as shown by mark ①  and a signal on a word line WL$_{n-1}$ corresponding to a previous address falls as shown by mark ② . Further, a PRC signal rises as shown by mark ③  by the rise of the ASD signal and a precharging operation is started by precharging circuits 7 and 7' with respect to the memory cell 8 and the dummy cell 21.

The dummy bit line DB/$\overline{DB}$ attains a precharge level by this precharging operation as shown by mark ④  and a bit line BLn/$\overline{BLn}$ of the memory cell 8 also attains a precharge level as shown by mark ⑤ . At this time, to more reliably perform the precharging operation of the dummy cell 21, it is preferable to arrange the dummy cell in a position farthest from an X decoder 2 such that the speed of this precharging operation on the dummy bit line is slower than that on the bit line of the memory cell 8.

When the dummy bit line DB/$\overline{DB}$ attains the precharge level, the dummy sense amplifier 22 detects the completion of the precharging operation and a PES signal rises as shown by mark ⑥ . A PRC signal from a PRC generating circuit 5 falls by the rise of the PES signal as shown by mark ⑦ , thereby completing the precharging operation. Further, the XDE signal from an XDE generating circuit 6 rises as shown by mark ⑧  and an output buffer 10 attains a high impedance state and is deactivated as shown by mark ⑨ .

The word line WL$_n$ corresponding to the present address is selected from the X decoder 2 and a signal on this line rises by the rise of the above XDE signal as shown by mark ⑩.

Thus, memory data are read of the memory cell 8 and are transmitted to the bit line BL$_n$/$\overline{BL_n}$ as shown by mark ⑪. The memory data are then amplified by the sense amplifier 9 and are transmitted to the output buffer 10. The dummy cell 21 is also accessed by the rise of the signal on the word line WL$_n$ so that fixed data stored to the dummy cell are transmitted to the dummy bit line DB/$\overline{DB}$ as shown by mark ⑫. Thus, the PES signal falls by the operation of the dummy sense amplifier 22 as shown by mark 13. The output buffer 10 is activated by this fall of the PES signal and the transmitted data from the memory cell 8 are outputted as a data output D$_{out}$.

In the above embodiment, the memory cell 8 and the dummy cell 21 are connected to each word line WL$_n$, but a dedicated word line for the dummy cell may be disposed. Further, the XDE signal is selected by the PES signal as shown by mark ⑧, but the XDE signal may rise through the rise of the PES signal, the operation shown by mark ⑦, the fall of the PRC signal and the operation shown by mark ⑳.

Figure 8:
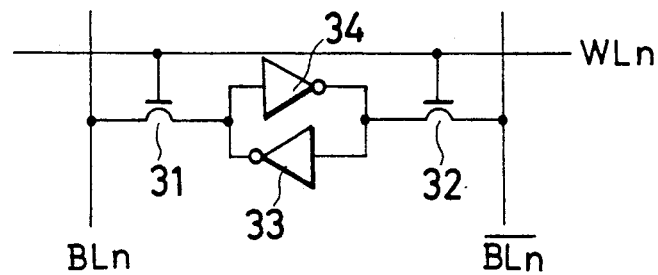
FIG. 8 is a circuit diagram showing one example of a memory cell in FIG. 6.

FIG. 8 shows an example of the circuit construction of the above memory cell 8. Each word line WL$_n$ is connected to gates of N-channel MOSFETs 31 and 32 for access and each of the sources of the respective FETs 31 and 32 is connected to the bit lines BL$_n$ and $\overline{BL_n}$. A flip-flop circuit is composed of inverters 33 and 34 inversely connected in parallel to each other and is connected between the drains of the FETs 31 and 32.

Figure 9:
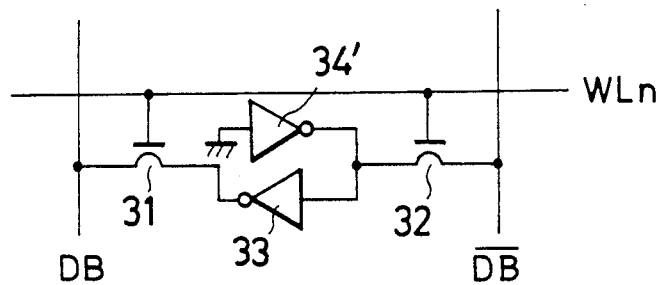
FIGS. 9 and 10 are circuit diagrams showing one example of a dummy cell in FIG. 6.

FIG. 9 shows an example of the circuit construction of the above dummy cell 21. The memory data are fixed by connecting one inverter 34' of the flip-flop circuit to the ground. An input portion of the other inverter 33 may be connected to a power source at a high voltage level.

Figure 10:
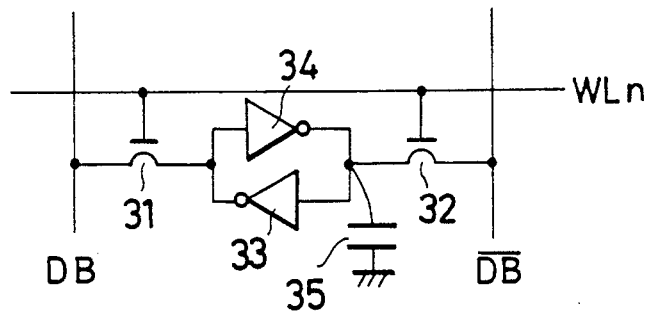

As shown in FIG. 10, it is possible to fix the memory data by adding a capacitor 35 to one node of the flip-flop circuit and unbalancing the right-hand and left-hand nodes. Further, it is also possible to fix the memory data by changing the sizes of the FETs.

Figure 11:
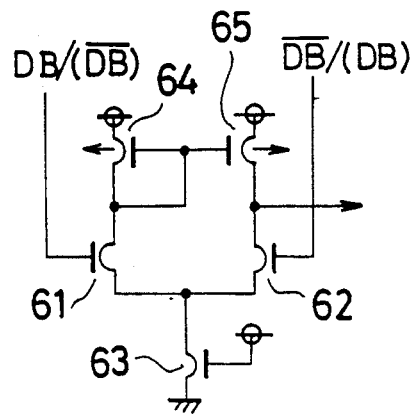
FIG. 11 is a circuit diagram showing one example of a precharging circuit in FIG. 6.

FIG. 11 shows an example of the circuit construction of the sense amplifier 9 composed of N-channel MOSFETs 61 to 63 and P-channel MOSFETs 64 and 65.

Figure 12:
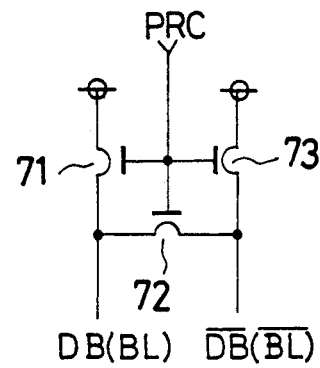
FIG. 12 is a circuit diagram showing one example of a sense amplifier in FIG. 6.

FIG. 12 shows an example of the circuit construction of the precharging circuits 7 and 7' composed of three N-channel MOSFETs 71 to 73.

The circuits shown in FIGS. 11 and 12 can be also used for the dummy cell. It is possible to construct the dummy sense amplifier 22 by inverters, NAND circuits, NOR circuits, etc.

In a second embodiment of the present invention, a semiconductor memory apparatus is operated at a high speed by operating an inverted SAT signal generating circuit disposed therein at a high speed.

Figure 13:
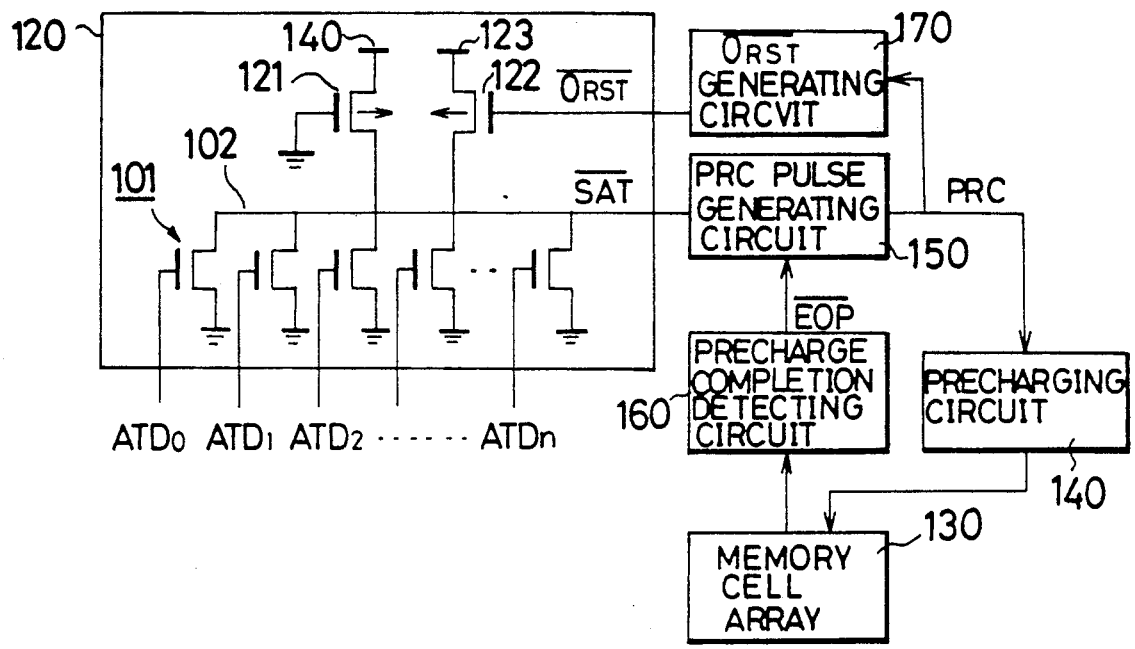
FIG. 13 is a block diagram showing the construction of a semiconductor memory apparatus in a second embodiment of the present invention.

FIG. 13 shows this semiconductor memory apparatus in the second embodiment of the present invention. In this figure, an inverted SAT signal generating circuit 120 generates an inverted SAT signal (which is shown as $\overline{SAT}$ in the figures) by supplying thereto an ATD signal from any one of a plurality of ATD pulse generating circuits. The inverted SAT signal generating circuit 120 is connected to a precharge (which is shown as PRC in the figures) pulse generating circuit 150 for transmitting a signal for starting a precharging operation to a precharging circuit 140 for precharging a bit line disposed in a memory cell array 130. The memory cell array 130 is connected to a precharge completion detecting circuit 160 for detecting the completion of the precharging operation on the bin line. An output side of the precharge completion detecting circuit 160 is connected to the above precharge pulse generating circuit 150. An output side of the precharge pulse generating circuit 150 is connected to an inverted reset signal generating circuit 170 for detecting that no precharge pulse is transmitted from the precharge pulse generating circuit 150 by supplying a precharge completion signal thereto from the precharge completion detecting circuit 160. This inverted reset signal generating circuit 170 transmits an inverted reset signal (which is shown as $\overline{ORST}$ in the figures) by the above detection to the inverted SAT signal generating circuit 120.

In the inverted SAT signal generating circuit 120, a PMOS transistor 122 is added to the SAT signal generating circuit 106 shown in FIG. 3 and the inverter 105 is removed. Namely, ATD signals transmitted from respective ATD pulse generating circuits are supplied to gates of a plurality of NMOS transistors 101 having sources connected to the ground. The output line 102 is connected to the drains of the NMOS transistors 101 and a drain of a PMOS transistor 121 having a source connected to a power source 104 and a gate connected to the ground. The output line 102 is also connected to a drain of a PMOS transistor 122 having a source connected to a power source 123 and a gate connected to an output side of the inverted reset signal generating circuit 170.

It is enough for the PMOS transistor 121 to transmit from the power source 104 an electric current provided to approximately maintain a high voltage level of the inverted SAT signal transmitted from the output line 102. The PMOS transistor 121 has a small ability for supplying the electric current to perform the fall of the inverted SAT signal at a high speed when the ATD signal is supplied and any one of the NMOS transistors 101 is turned on. On the other hand, the PMOS transistor 122 has a large ability for supplying the electric current to rapidly charge a wiring capacitor added to the output line 102.

The operation of the semiconductor memory apparatus constructed above in this embodiment will next be described with reference to FIG. 14.

Figure 14:
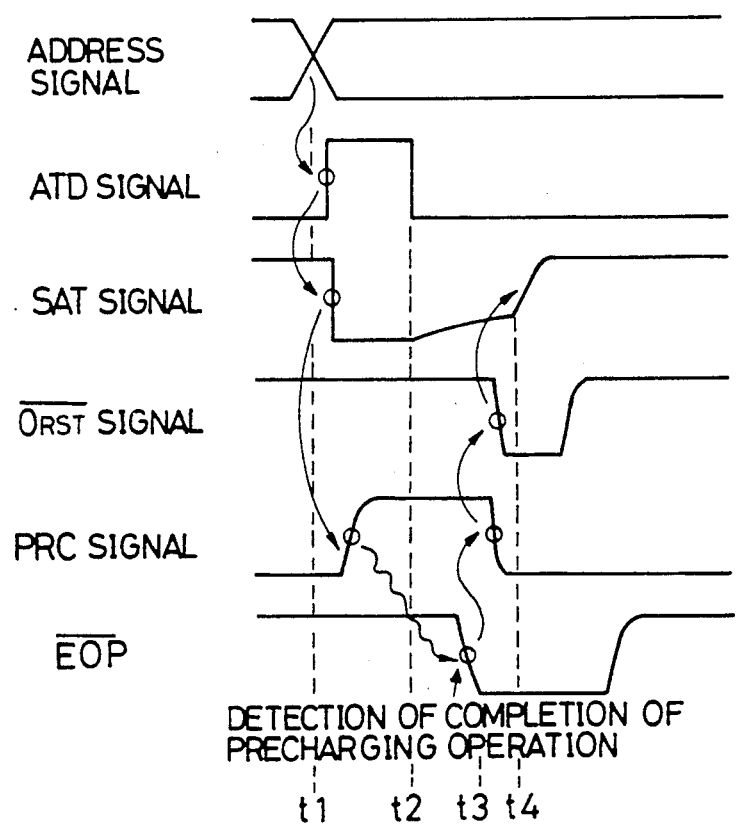
FIG. 14 is a timing chart showing the operation of the semiconductor memory apparatus shown in FIG. 13.

As shown by FIG. 14, when an address signal supplied to the memory cell array 130 is changed at a time t1, the unillustrated ATD pulse generating circuit detects the change in this signal and transmits a pulse of the ATD signal at a high voltage level to the inverted SAT signal generating circuit 120 as shown by FIG. 14. Thus, any one of the NMOS transistors 101 receiving the ATD signal is turned on and the output line 102 attains a ground level as shown by FIG. 14. Accordingly, as shown by FIG. 14, the precharge pulse generating circuit 150 transmits transmits a precharge signal at a high voltage level to the precharging circuit 140 by detecting the change in voltage level of the signal transmitted from the inverted SAT signal generating circuit 120. Accordingly, the precharging circuit 140 starts the precharging operation on the bit line disposed in the memory cell array 130.

The precharge completion detecting circuit 160 detects the completion of the precharging operation on the bit line of the memory cell array 130 and transmits an inverted EOP signal to the precharge pulse generating circuit 150 at a time t3 as shown by FIG. 14. As shown by FIG. 14, the precharge pulse generating circuit 150 receives this inverted EOP signal so that the PRC signal falls and attains a low voltage level. The inverted preset signal generating circuit 170 detects the change in voltage level of the signal transmitted from the precharge pulse generating circuit 150. As shown by FIG. 14, this inverted preset signal generating circuit 170 then changes the signal at the high voltage level and transmits a preset signal at a low voltage level to the gate of the PMOS transistor 122 disposed in the inverted SAT generating circuit 120. The PMOS transistor 122 receiving this preset signal attains a turning-on state after a time t4.

As shown by FIG. 14, the output line 102 of the inverted SAT signal generating circuit 120 is at the ground level since any one of the NMOS transistors 101 is turned on until a time t2 at which the ATD signal is supplied. However, thereafter, this output line is gradually charged from the power source 140 through the PMOS transistor 121. The output line 102 is rapidly charged by the power source 123 and returns to the signal state at the high voltage level from the time t4 at which the PMOS transistor 122 having the large electric current supply ability is turned on. Thus, since the PMOS transistor 122 is newly added, the fall time of the inverted SAT signal is determined by the above wiring capacitor and the NMOS transistors 101 and the rise time of the inverted SAT signal is determined by the above wiring capacitor and the PMOS transistor 122. Accordingly, when the electric current capabilities of the NMOS transistors 101 and the PMOS transistor 122 are suitably set to be large as much as possible, the inverted SAT signal can rise and fall at a high speed so that it is possible to operate the memory cell at a high speed.

Since the PMOS transistor having the large electric current supply ability is disposed to rapidly recover the potential on the output line 102, it is possible to reduce the electric current supply ability of the PMOS transistor 121 and reduce the consumed amount of the electric current during the precharging period. Further, since it is sufficient for the PMOS transistor 121 to have the small electric current supply ability, the potential on the output line 102 can be rapidly reduced to the low level when the NMOS transistors 101 are turned on by the supply of the ATD signal.

In a third embodiment of the present invention, the dummy cell shown in the first embodiment is applied to the above-mentioned second embodiment.

Figure 15:
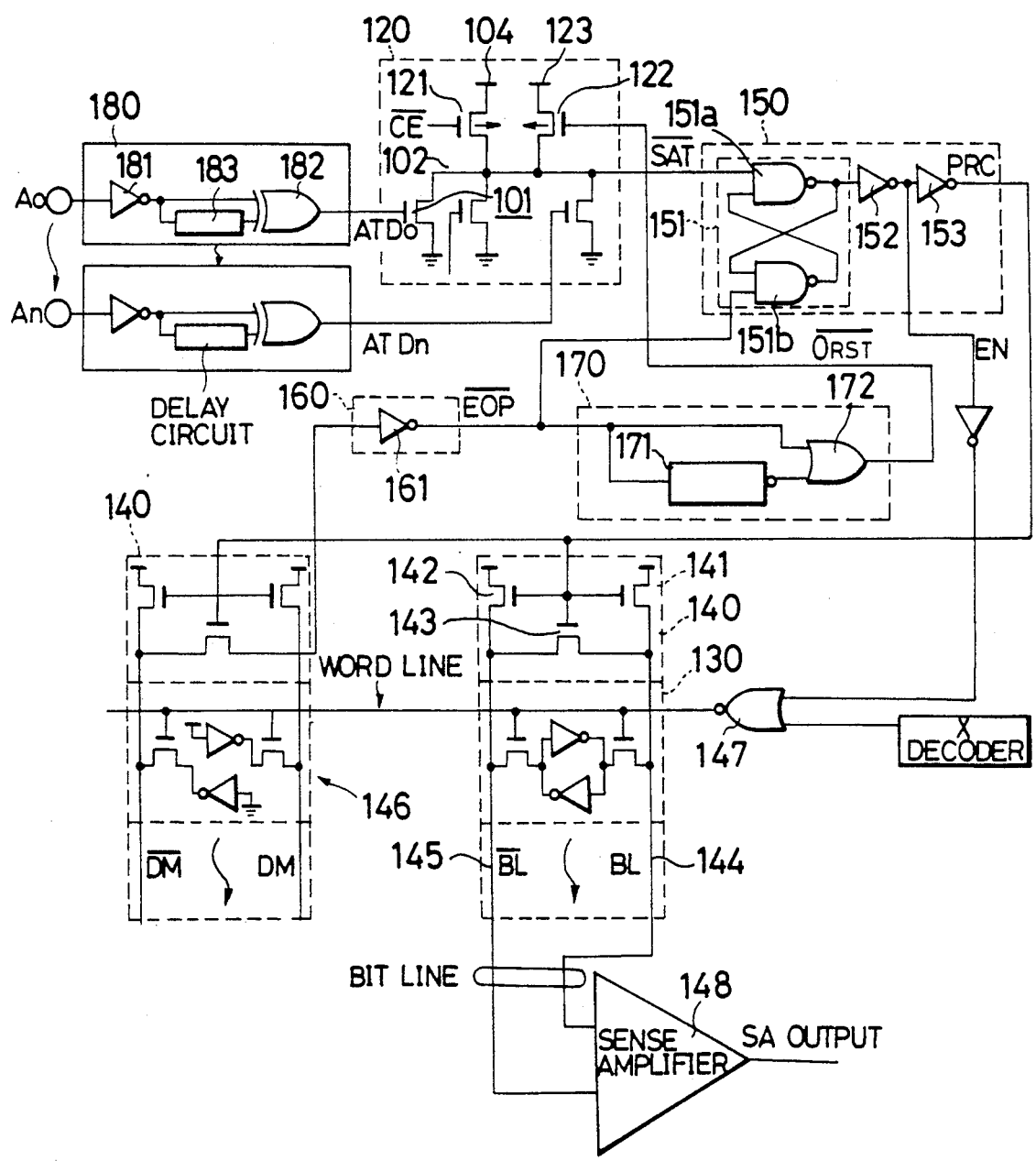
FIG. 15 is a circuit diagram showing the construction of a semiconductor memory apparatus in a third embodiment of the present invention.

In FIG. 15 showing the third embodiment, the same constructional portions as those in FIG. 13 are designated by the same reference numerals and the description thereof is omitted. The block portions shown in FIG. 13 are shown by logic circuits in FIG. 15. The circuit construction of a semiconductor memory apparatus in this embodiment is basically similar to that shown in FIG. 13.

In each of ATD pulse generating circuits 180, an output side of an inverter 181 for receiving each bit data of an address signal is connected to one input terminal of an EXOR circuit 182. The output side of the inverter 181 is connected to the other input terminal of the EXOR circuit 182 through a delay circuit 183. An output side of the EXOR circuit 182 is connected to a gate of each NMOS transistors 101.

A precharge pulse generating circuit 150 is constructed by an RS latch circuit 151 of a NAND type and inverters 152 and 153. An output line 102 disposed in an inverted SAT signal generating circuit 120 is connected to an input terminal of a NAND circuit 151a constituting the latch circuit 151. An output side of the latch circuit 151 is connected to respective gates of MOS transistors 141 to 143 disposed in a precharging circuit 140 through the inverters 152 and 153. An output side of the inverter 152 is connected to a word line driver 147 for selecting memory cells disposed in a memory cell array 130. The respective drains of the MOS transistors 141 and 142 are connected to a power source and the sources thereof are connected to a bit line 144 and an inverted bit line 145. The source and drain of the MOS transistor 143 are connected to the bit line 144 and the inverted bit line 145. The bit line 144 and the inverted bit line 145 are connected to a sense amplifier 148 for amplifying a signal on the bit line.

No data can be stored to the memory cell array 130, but a dummy cell 146 having the same capacitance as that on the bit line disposed in a normal memory cell is disposed. The bit line of this dummy cell 146 is connected to a precharge completion detecting circuit 160 composed of an inverter 161. An output side of the precharge completion detecting circuit 160 is connected to an input terminal of a NAND circuit 151b disposed in the precharge pulse generating circuit 150. An output side of the precharge completion detecting circuit 160 is connected to an inverted reset signal generating circuit 170. This construction is different from that in the second embodiment.

The inverted reset signal generating circuit 170 is constructed by a delay circuit 171 and a NOR circuit 172. An output side of the precharge completion detecting circuit 160 is connected to one input terminal of the NOR circuit 172 through the delay circuit 171 and is directly connected to the other input terminal of the NOR circuit 172. An output side of the NOR circuit 172 is connected to a gate of a PMOS transistor 122 disposed in the inverted SAT signal generating circuit 120.

The operation of the semiconductor memory apparatus constructed above in the third embodiment will next be described with reference to FIG. 16.

Figure 16:
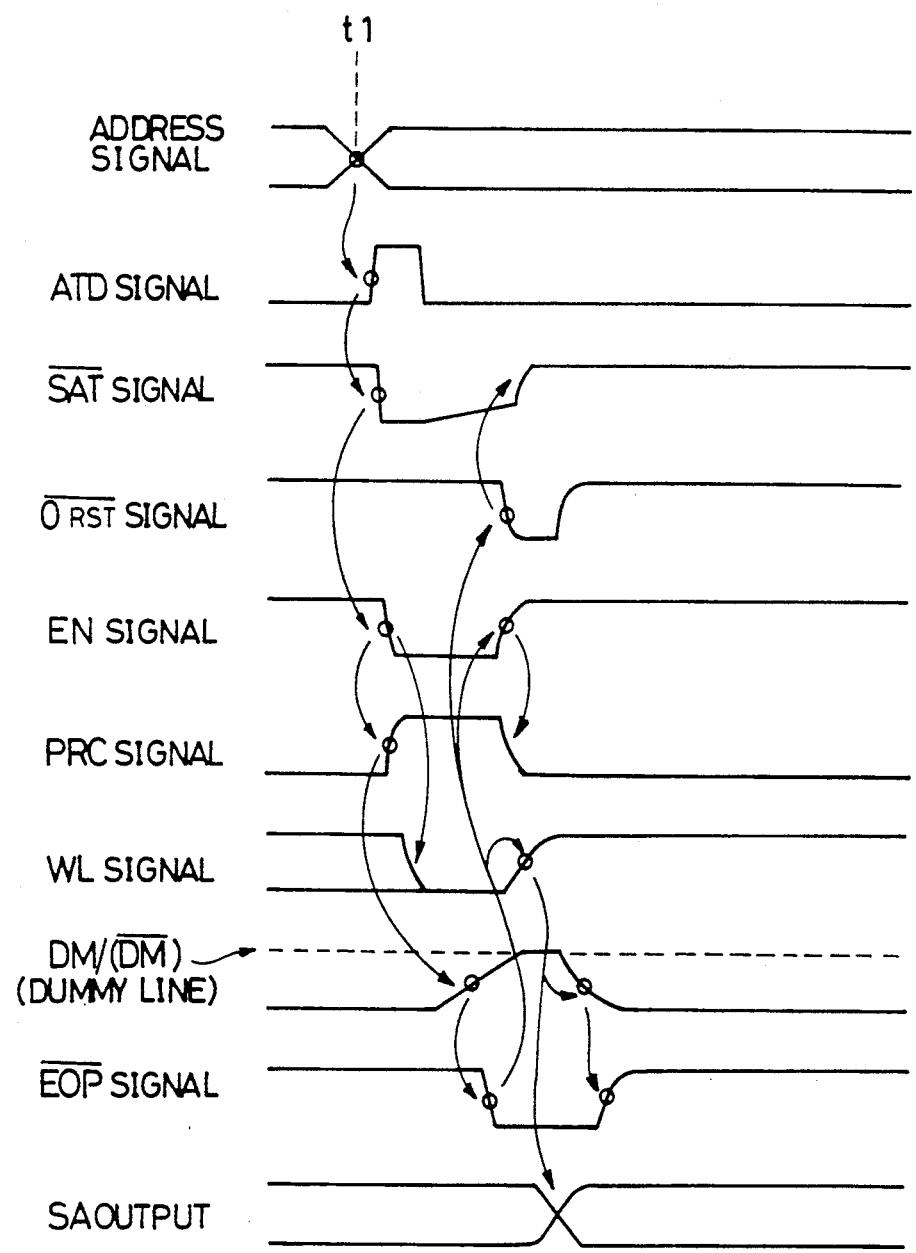
FIG. 16 is a timing chart showing the operation of the semiconductor memory apparatus shown in FIG. 15.

As shown by item address signal of FIG. 16, after an address signal is changed at a time t1, the operation of the apparatus is similar to that in the above second embodiment from the beginning of the operation of the inverted SAT signal generating circuit 120 to the completion of the operation of the precharge pulse generating circuit 150. When the voltage level of a precharge signal is changed to a high voltage level, the bit line of the dummy cell 146 is precharged as shown by item DM/($\overline{DM}$) of FIG. 16. As shown by item $\overline{EOP}$ signal of FIG. 16, the precharge completion detecting circuit 160 detects that a precharge potential on this bit line reaches a predetermined value so that an inverted EOP signal level is changed to a low voltage level. Thus, as shown by item $\overline{ORST}$ signal of FIG. 16, the inverted reset signal generating circuit 170 transmits the signal at the low voltage level to the gate of the PMOS transistor 122 disposed in the inverted SAT signal generating circuit 120. Accordingly, similar to the second embodiment, the output line 102 disposed in the inverted SAT signal generating circuit 120 is rapidly charged. Further, since the voltage level of the output signal of the precharge completion detecting circuit 160 is changed to the low voltage level, an EN signal is generated from the precharge pulse generating circuit 150 as shown by item EN signal of FIG. 16. Thus, the word line disposed in the memory cell array 130 is selected and a signal on the bit line 145 or 146 is amplified by the sense amplifier 148 and is transmitted from the sense amplifier 148 as shown by item SA output of FIG. 16.

In the third embodiment, the output signal of the precharge completion detecting circuit 160 falls so that the inverted reset signal is generated, but the inverted reset signal may be generated by the rise of the above output signal.

In the second and third embodiments, the CMOS transistor and the static read-write memory are described, but the present invention is not limited to these memories.

Further, the data are read out of the memory cell, but similar effects can be also obtained when the data are written.

As mentioned above, in accordance with the present invention, the completion of the precharging operation of the memory cell is detected by the detection of the completion of the precharging operation with respect to the dummy cell. Accordingly, the apparatus of the present invention can follow the dispersion in process for manufacturing the memory and the circuit is small and the internal signal is generated at a high speed.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor memory apparatus having an internal signal generating circuit for generating an internal signal by detecting a change in supplied signal and a precharging circuit for precharging a bit line of a semiconductor memory cell by the supply of said internal signal, said apparatus comprising:
    a first transistor connected to an output line of the internal signal generating circuit and having an ability for supplying an electric current set to be small such that a signal level on said output line is maintained at a predetermined voltage level, wherein the first transistor has the small electric current supply ability to perform the fall of the signal transmitted from the output line at a high speed;
    a second transistor connected to the output line of the internal signal generating circuit and having an ability for supplying the electric current set to be large such that the output line of the internal signal generating circuit can be rapidly charged by turning the second transistor on; and
    a first circuit for turning said second transistor on after the completion of the precharging operation on the bit line after the internal signal is generated.

2. A semiconductor memory apparatus having an internal signal generating circuit for generating an internal signal by detecting a change in supplied signal and a precharging circuit for precharging a bit line of a semiconductor memory cell by the supply of said internal signal, said apparatus comprising:
    a first transistor connected to an output line of the internal signal generating circuit and having an ability for supplying an electric current set to be small such that a signal level on said output line is maintained at a predetermined voltage level;
    a second transistor connected to the output line of the internal signal generating circuit and having an ability for supplying the electric current set to be large such that the output line of the internal signal generating circuit can be rapidly charged by turning the second transistor on, wherein the second transistor has the large electric current supply ability to rapidly charge a wiring capacitor added to the output line; and
    a first circuit for turning said second transistor on after the completion of the precharging operation on the bit line after the internal signal is generated.

3. A semiconductor memory apparatus of an internal synchronization type having an internal signal generating circuit for generating an internal synchronization signal by detecting a change in address or control signal, said apparatus comprising:
    a dummy memory cell for fixing data thereto in advance;
    a precharging circuit for precharging an internal memory cell and the dummy cell;
    precharge completion detecting means for detecting the completion of the precharging operation when a dummy bit line from the dummy cell attains a predetermined voltage level by the precharging operation, said precharge completion detecting means transmitting a signal for completing the precharging operation with respect to said precharging circuit;
    a first transistor connected to an output line of the internal signal generating circuit and having the ability of supplying an electric current set to be small such that a signal level on said output line is maintained at a predetermined voltage level;
    a second transistor connected to the output line of the internal signal generating circuit and having the ability of supplying the electric current set to be large such that the output line of the internal signal generating circuit can be rapidly charged by turning the second transistor on; and
    a first circuit for turning said second transistor on after the completion of the precharging operation on the bit line after the internal signal is generated.

4. A semiconductor memory apparatus as claimed in claim 3, wherein the data are read or written through a bit line to the memory cell by the completion of the precharging operation by said precharge completion detecting means.

5. A semiconductor memory apparatus having an internal signal generating circuit for generating an internal signal by detecting a change in a supplied signal and a precharging circuit for precharging a bit line of a semiconductor memory cell by the supply of said internal signal, said internal signal generating circuit having an output line and including a wiring capacitor connected to said output line, said apparatus comprising:
    a first transistor which is connected to said output line of the internal signal generating circuit and has the ability to supply electric current at a rate which is sufficient to maintain a voltage signal level on said output line but insufficient to cause a rapid change of the voltage level of said output line;
    a second transistor which also is connected to the output line of the internal signal generating circuit but has the ability to supply electric current at a rate which is sufficient to rapidly charge both the output line of the internal signal generating circuit and said wiring capacitor connected to the output line when the second transistor is turned on; and
    a first circuit for turning said second transistor on after the completion of a precharging operation on the bit line after the internal signal is generated.

* * * * *